(12) United States Patent
Minamizaki et al.

(10) Patent No.: US 7,027,027 B2
(45) Date of Patent: Apr. 11, 2006

(54) DIFFERENTIAL AMPLIFIER AND SEMICONDUCTOR INTEGRATED CIRCUIT FOR LCD DRIVE

(75) Inventors: Hironori Minamizaki, Kanagawa (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 191 days.

(21) Appl. No.: 10/226,198

(22) Filed: Aug. 23, 2002

(65) Prior Publication Data

US 2003/0038655 A1 Feb. 27, 2003

(30) Foreign Application Priority Data

Aug. 24, 2001 (JP) .............................. 2001/254755

(51) Int. Cl.
*G09G 3/36* (2006.01)

(52) U.S. Cl. ......................................... 345/98; 345/204

(58) Field of Classification Search .................. 327/65, 327/66, 52, 89, 96; 330/252–254, 257; 345/98, 345/87, 92, 204, 205
See application file for complete search history.

(56) References Cited

U.S. PATENT DOCUMENTS

| | | | |
|---|---|---|---|
| 4,536,663 A | | 8/1985 | Miller et al. |
| 4,554,515 A | | 11/1985 | Burson et al. |
| 4,555,673 A | | 11/1985 | Huijsing et al. |
| 4,977,378 A | * | 12/1990 | Tero ............................ 330/252 |
| 5,280,199 A | | 1/1994 | Itakura |
| 5,608,352 A | * | 3/1997 | Itakura ........................ 330/252 |
| 5,623,279 A | | 4/1997 | Itakura et al. |
| 5,675,289 A | * | 10/1997 | Schrittesser .................. 330/253 |
| 6,339,355 B1 | * | 1/2002 | Yamauchi et al. ............. 327/65 |
| 6,411,162 B1 | | 6/2002 | Minamizaki et al. |
| 6,448,836 B1 | * | 9/2002 | Kokubun et al. ............ 327/307 |
| 6,563,270 B1 | * | 5/2003 | Koyama ...................... 345/87 |

FOREIGN PATENT DOCUMENTS

| | | |
|---|---|---|
| CN | 1291762 | 4/2001 |
| JP | 4-356816 | 12/1992 |
| JP | 5-81877 | 4/1993 |
| JP | 8-256026 | 10/1996 |
| JP | 11-127043 | 5/1999 |
| JP | 2001-100713 | 4/2001 |

* cited by examiner

*Primary Examiner*—Amare Mengistu
(74) *Attorney, Agent, or Firm*—Oblon, Spivak, McClelland, Maier & Neustadt, P.C.

(57) ABSTRACT

A differential amplifying circuit according to the present invention, comprising: a first differential pair having first and second transistors of the same conduction type, which outputs differential output signals in accordance with differential input signals supplied to gate terminals of said first and second transistors from differential output terminals; a second differential pair having third and fourth transistors having the same conduction type as that of said first and second transistors with threshold voltages different from each other, which outputs differential output signals in accordance with said differential input signals supplied to gate terminals of said third and fourth transistors from said differential output terminals; a bias supply part which supplies bias current to said first and second differential parts; and a differential pair control part which controls whether or not to operate said second differential pair.

14 Claims, 9 Drawing Sheets

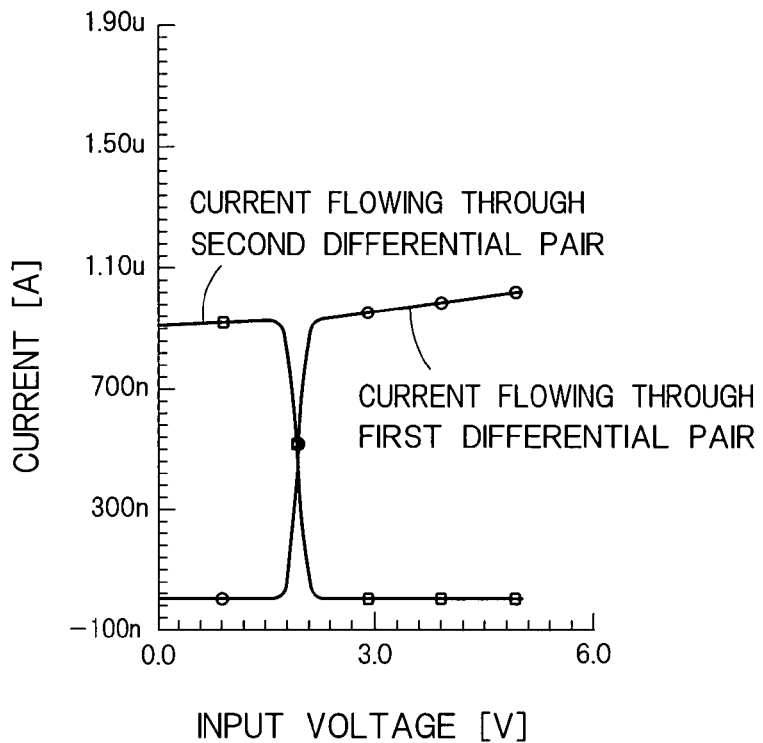
F I G. 3
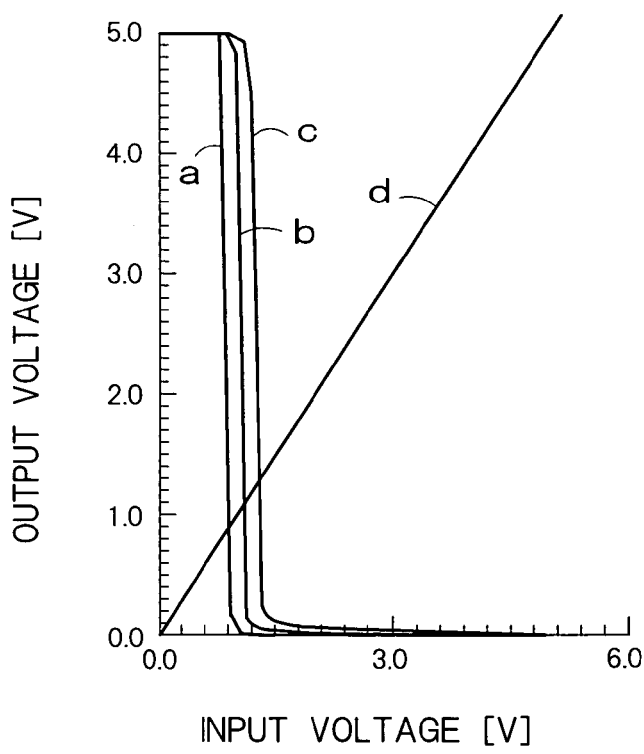
F I G. 4

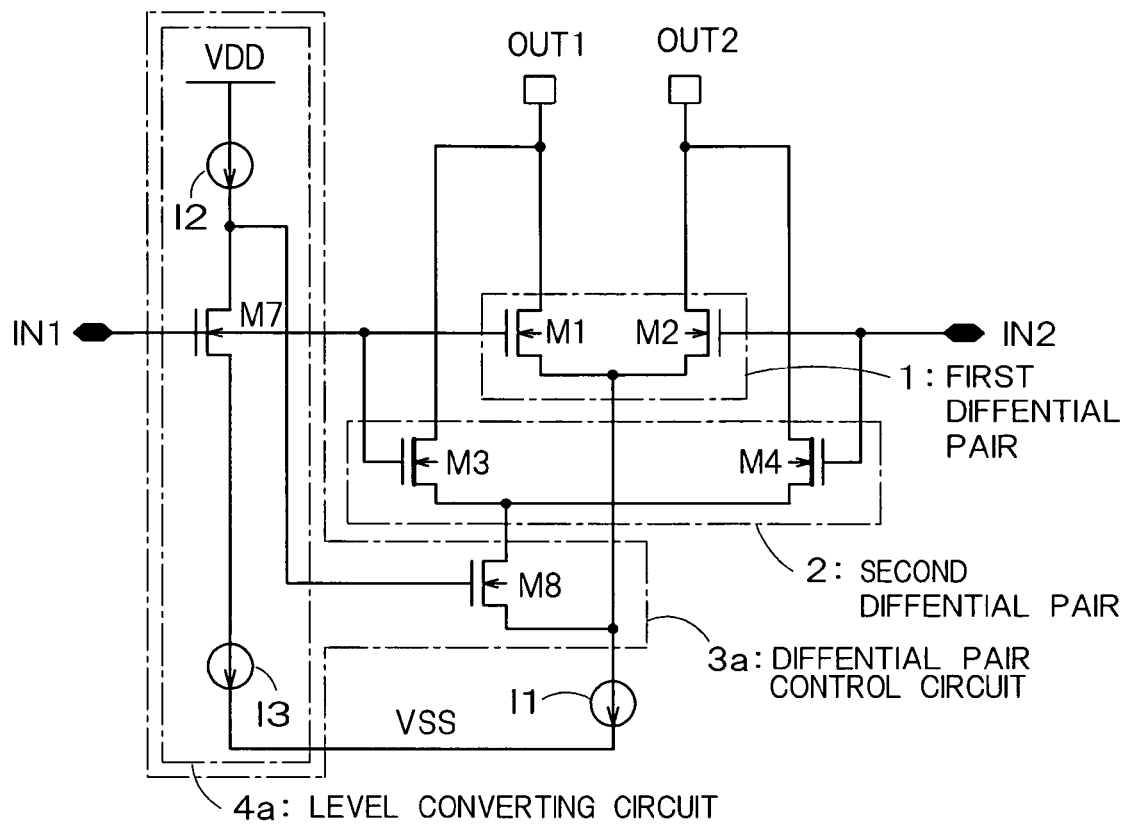
F I G. 7
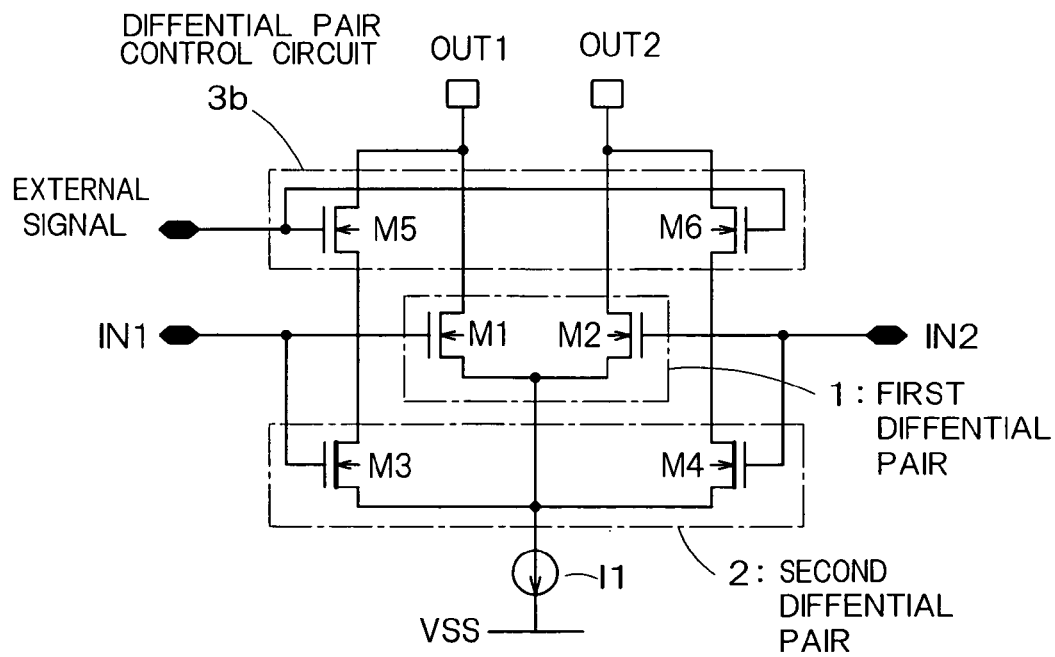
F I G. 8

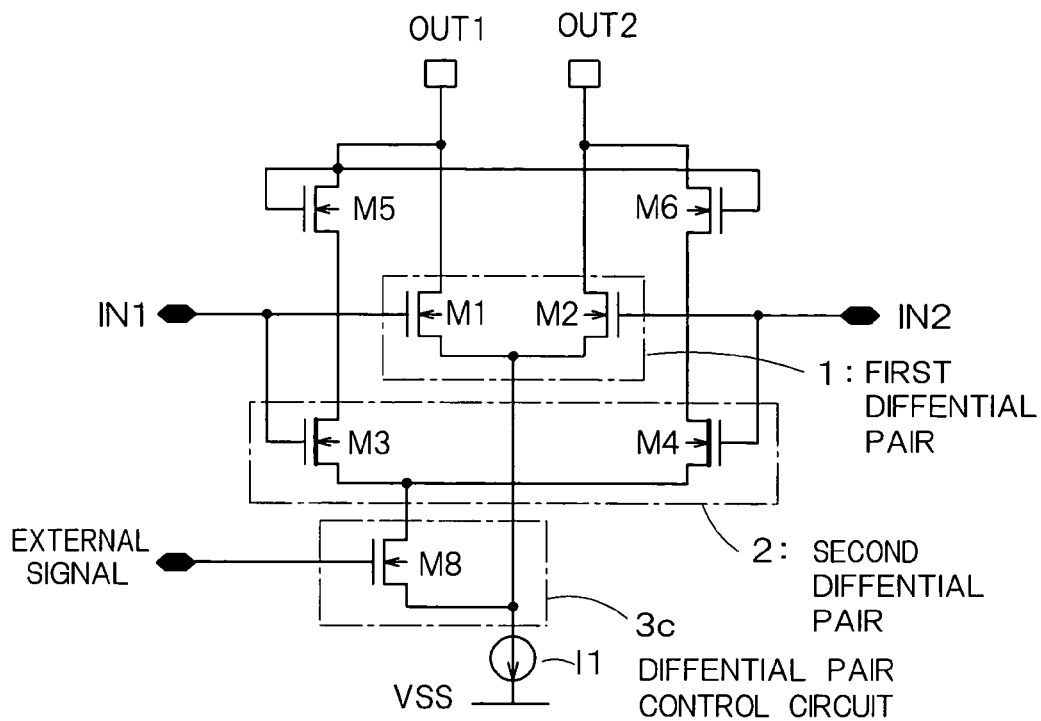
F I G. 12
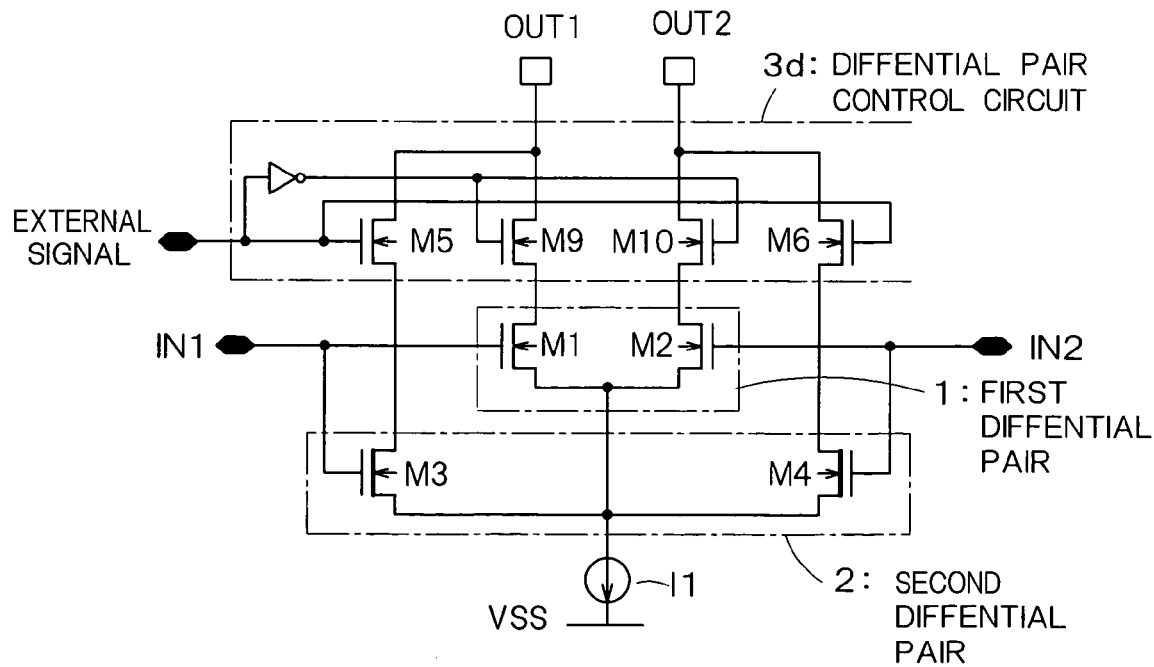
F I G. 13

DIFFERENTIAL AMPLIFIER AND SEMICONDUCTOR INTEGRATED CIRCUIT FOR LCD DRIVE

CROSS REFERENCE TO RELATED APPLICATIONS

This application is based upon and claims the benefit of priority from the prior Japanese Patent Applications No. 2001-254755, filed on Aug. 24, 2001, the entire contents of which are incorporated herein by reference.

BACKGROUND OF THE INVENTION

1. Field of the Invention

The present invention relates to a differential amplifier and a semiconductor integrated circuit for LCD drive which amplifies differential input signals to output an amplified output.

2. Related Background Art

The conventional differential amplifying circuit is generally realized by using a differential pair of transistors. There is a problem in which operational range of a common mode voltage of the differential input signals is limited due to influence of gate-source voltages Vgs of MOS transistors composing the differential pair.

As a method of solving such a problem, U.S. Pat. No. 4,554,515 and Japanese Patent document No. H4-76246 discloses a method of adding current of two differential pairs of conduction types different from each other in order to enlarge operational range of the common mode voltage of the differential input signals.

However, there are the following problems 1)–3) in this method.

1) In accordance with size of the common mode voltage of the differential input signal, the respective input conversion offsets corresponding to two differential pairs are added and output deviation becomes large.

2) Because directions of the respective output current corresponding to two differential pairs are in reverse to each other, a current addition circuit must be provided. Because of this, the number of components increases, thereby enlarging circuit volume.

3) Sum of the differential output current fluctuates depending on an operational point of the common mode voltage of the differential input signals.

On the other hand, Japanese Patent Laid Open No. H8-256026 discloses a method of adding currents corresponding to the outputs of the differential pair with the same conduction type and different threshold voltages in order to enlarge operation range of the common mode voltages of the differential input signals.

FIG. 17 is a circuit diagram of the differential amplifying circuit disclosed in the H8-256026. The differential amplifying circuit of FIG. 17 has a first differential pair composed of NMOS transistors M1 and M2, a second differential pair composed of NMOS transistors M3 and M4, an NMOS transistor M31 composing a current source for supplying current to the first differential pair, an NMOS transistor M32 composing a current source for supplying current to the second differential pair, PMOS transistors M15 and M16 composing an active load connected to the output terminals of the first and second differential pairs, and a PMOS transistor M34 and an NMOS transistor M33 composing an output circuit.

However, because the differential amplifying circuit of FIG. 17 supplies current from separate current sources to the respective differential pairs, there is the same problem as that that of the above 3), i.e. sum of the differential output currents fluctuates depending on the operational point of the common mode voltages of the differential input signals. Because of this, a stable output is not obtained, and the operational range of the common mode voltages of the differential input signals is not so much enlarged.

SUMMARY OF THE INVENTION

A differential amplifier circuit according to an embodiment of the present invention, comprising:

a first differential pair having first and second transistors of the same conduction type, which outputs differential output signals in accordance with differential input signals supplied to gate terminals of said first and second transistors from differential output terminals;

a second differential pair having third and fourth transistors having the same conduction type as that of said first and second transistors with threshold voltages different from each other, which outputs differential output signals in accordance with said differential input signals supplied to gate terminals of said third and fourth transistors from said differential output terminals;

a bias supply part which supplies bias current to said first and second differential parts; and a differential pair control part which controls whether or not to operate said second differential pair.

A semiconductor integrated circuit for LCD drive according to the present invention, comprising:

a D/A converting circuit which converts digital pixel data into an analog pixel voltage; and an analog buffer which performs buffering of said analog pixel voltage and supplies the buffered analog pixel voltage to the corresponding signal line, wherein said analog buffer has a differential amplifying circuit which performs differential amplification of said analog pixel voltage outputted from said D/A converting circuit at differential signals;

said differential amplifying circuit including:

a first differential pair having first and second transistors of the same conduction type, gate terminals of said first and second transistors being supplied with differential input signals;

a second differential pair having third and fourth transistors of the same conduction type with threshold voltages different from each other, gate terminals of said third and fourth transistors being supplied with said differential input signals;

a bias supply part which supplies bias current to said first and second differential pairs; and a differential pair control part which controls whether or not to operate said second differential pair.

BRIEF DESCRIPTION OF THE DRAWINGS

FIG. 3 is a diagram showing a relationship between a voltage at one input IN1 of differential input signals and current flowing through first and second differential pairs.

FIG. 4 is a diagram showing a relationship between a voltage at one input IN1 of differential input signals and an output voltage of a level converting circuit.

FIG. 7 is a circuit diagram of a second embodiment of a differential amplifying circuit according to the present invention.

FIG. 8 is a circuit diagram of a third embodiment of a differential amplifying circuit according to the present invention.

FIG. 12 is a circuit diagram of a sixth embodiment of a differential amplifying circuit according to the present invention.

FIG. 13 is a circuit diagram of a seventh embodiment of a differential amplifying circuit according to the present invention.

DESCRIPTION OF THE PREFERRED EMBODIMENTS

Hereinafter, a differential amplifying circuit according to the present invention will be more specifically described with reference to drawings.

(First Embodiment)

Figure 1:
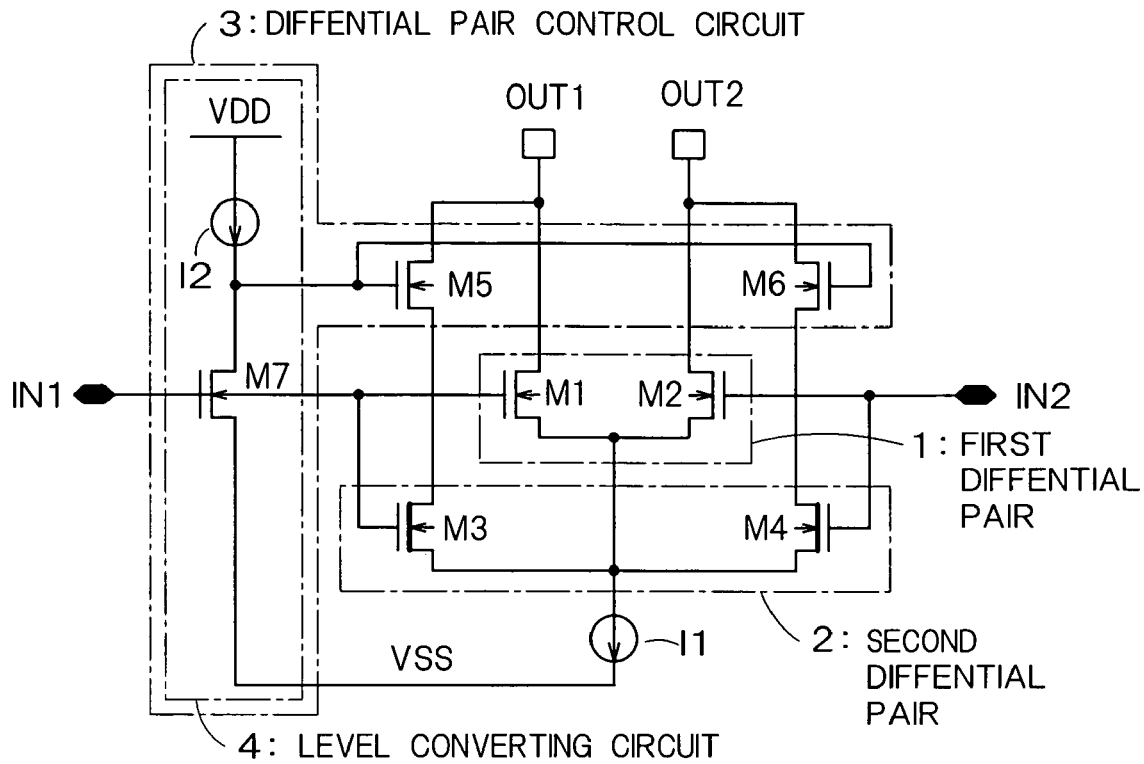
FIG. 1 is a circuit diagram of a first embodiment of a differential amplifying circuit according to the present invention.

FIG. 1 is a circuit diagram of a first embodiment of a differential amplifying circuit according to the present invention. The differential amplifying circuit of FIG. 1 has a first differential pair composed of NMOS transistors M1 and M2, a second differential pair composed of NMOS transistors M3 and M4, a current source I1 for supplying current to first and second differential pairs 1 and 2, and a differential pair control circuit 3 for controlling whether or not to operate the second differential pair 2.

The differential control circuit 3 has NMOS transistors M5 and M6 connected to a current path on which current from the current source I1 passes through the NMOS transistors M3 and M4, and a level converting circuit 4 for controlling gate voltages of the NMOS transistor M5 and M6.

The threshold voltages of the NMOS transistors M1 and M2 composing the first differential pair 1 are set to a higher value than those of the NMOS transistors M3 and M4. For example, the former threshold voltages are about 0.8V, and the latter threshold voltages are about −0.6V. The threshold voltages are adjusted by changing the amount of dope of impurity ion injected in a channel region of each transistor.

The level converting circuit 4 has a current source I2 and an NMOS transistor M7 connected in series between a power supply terminal VDD and a ground terminal Vss. A voltage at a connection point between the current source I2 and the NMOS transistor M7 is supplied to the NMOS transistors M5 and M6.

The gate terminals of the NMOS transistors M1 and M3 are supplied with one IN1 of the differential input signals, and the gate terminals of the NMOS transistors M2 and M4 are supplied with the other IN2 of the differential input signals.

The differential amplifying circuit of FIG. 1 has a feature in which a differential pair control circuit 3 is added to configurations of the conventional differential amplifying circuit. Hereinafter, the operation of the differential amplifying circuit of FIG. 1 will be described. Hereinafter, it is assumed that a relationship of the threshold voltage of the second differential pair 2<the threshold voltage of the first differential pair 1<the threshold voltage of the NMOS transistor M7 is established.

If one input IN1 of the differential input signals is less than the threshold voltage of the second differential pair 2, the first and second differential pairs 1 and 2 are in non-operational state.

When the input IN1 is not less than the threshold voltage of the second differential pair 2 and less than the threshold voltage of the first differential pair 1, the NMOS transistors M3 and M4 composing the second differential pair 2 turn on. At this time, because the NMOS transistor M7 is OFF, the NMOS transistors M5 and M6 turn on, and the current from the current source I1 passes through the second differential pair 2 and the NMOS transistors M5 and M6. The first differential pair 1 is constantly in non-operational state, and only the second differential pair 2 operates.

When the input IN1 exceeds the threshold voltage of the first differential pair 1, the NMOS transistors M1 and M2 composing the first differential pair 1 turn on, and both of the first and second differential pairs 1 and 2 become operational state. In this case, because the impedance of the second differential pair with lower threshold voltage is smaller, almost all the current from the current source I1 flows through the second differential pair 2.

On the other hand, if the input IN1 exceeds the threshold voltage of the NMOS transistor M7 in the level converting circuit 4, the NMOS transistor M7 turns on, and the NMOS transistors M5 and M6 turn off. Therefore, the current path of the second differential pair 2 is cut off, and the second differential pair 2 becomes non-operational state. At this time, because the first differential pair 1 operates, the current from the current source I1 flows through only the first differential pair 1. That is, at the voltage range in which the input IN1 is higher than the threshold voltage of the NMOS transistor M7, the differential amplifying circuit of FIG. 1 performs the differential amplifying operation by only the first differential pair 1.

Figure 2:
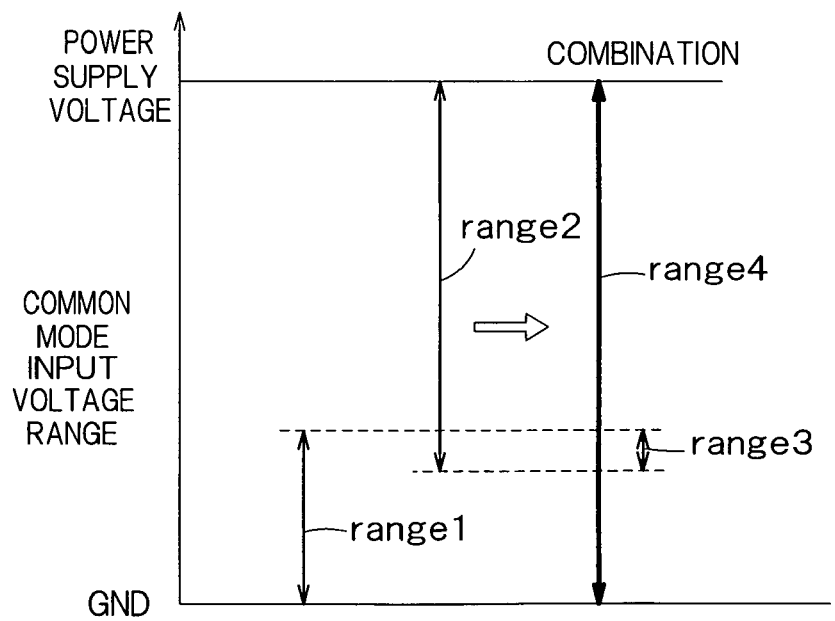
FIG. 2 is a diagram showing operational voltage range of first and second differential pairs.

FIG. 2 is a diagram showing the operational voltage range of the first and second differential pairs 1 and 2, and FIG. 3 is a diagram showing relationship between the voltage of one IN 1 of the differential input signals and the current flowing through the first and second differential pairs 1 and 2. As shown in FIG. 2, the second differential pair 2 operates at a range (range 1 of FIG. 2) in which the voltage of the input IN1 is low, and the first differential pair 1 operates at a range (range 2) in which the voltage of the input IN1 is higher. The level converting circuit 4 switches on/off of the NMOS transistor M7 within a range (range 3) in which the first and second differential pairs 1 and 2 operate. At time before or after when the NMOS transistor M7 turns on/off, the current flowing through the first and second differential pairs 1 and 2 changes largely as shown in FIG. 3. Therefore, the output voltage of the differential amplifying circuit of FIG. 1 swings at large voltage range as shown at a range 4 of FIG. 2.

FIG. 4 is a diagram showing relationship between the input IN1 of one of the differential input signals and the output voltage of the level converting circuit 4. Three curves a, b and c of FIG. 4 show property in the case where element sizes of transistors in the level converting circuit 4 are different from each other, and the line d shows relationship of the input/output voltage of FIG. 1. As shown in FIG. 4, it is possible to variably control the output voltage of the level converting circuit 4 by adjusting the element sizes of the transistors in the level converting circuit 4. The adjustment of such element sizes may be performed with regard to at least one of the NMOS transistor M7 in the level converting circuit 4 and the transistors composing the current source I1.

Instead of the current source I2 in the level converting circuit 4 of FIG. 1, an impedance element such as a resistor element may be connected.

Figure 5:
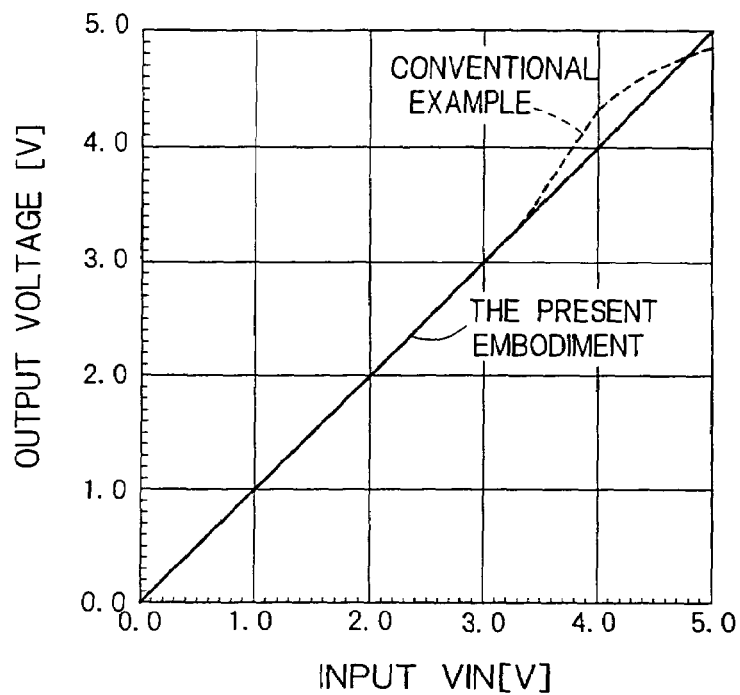
FIG. 5 is a diagram showing input/output property of the circuit of the present embodiment and the conventional circuit.
Figure 17:
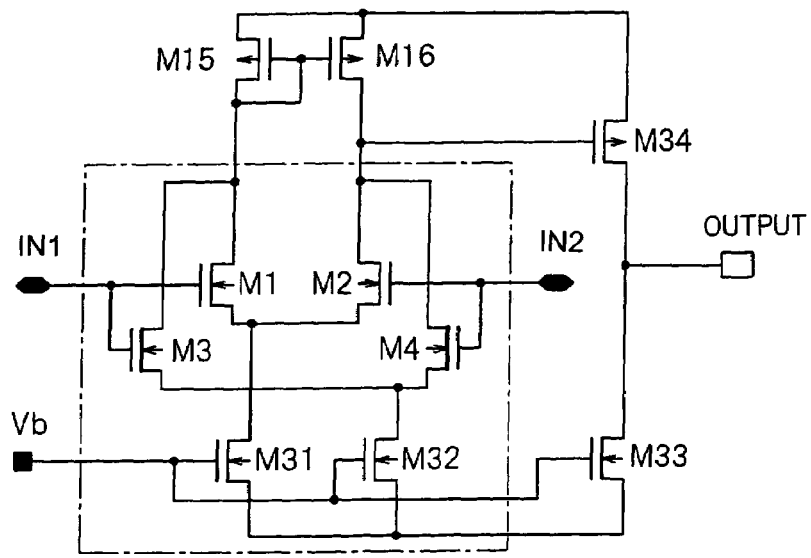
FIG. 17 is a circuit diagram of the conventional differential amplifying circuit.

FIG. 5 is a diagram showing input/output properties of the circuit of the present embodiment and the conventional circuit, a horizontal axis is the input voltage, and a vertical axis is the output voltage. A solid line of FIG. 5 shows the property of the circuit of the present embodiment, and the dotted line of FIG. 5 shows the property of the conventional circuit of FIG. 17. As shown in FIG. 5, according to the present embodiment, even when the input voltage is low or high, the output voltage linearly changes for the variation of the input voltage.

Figure 6:
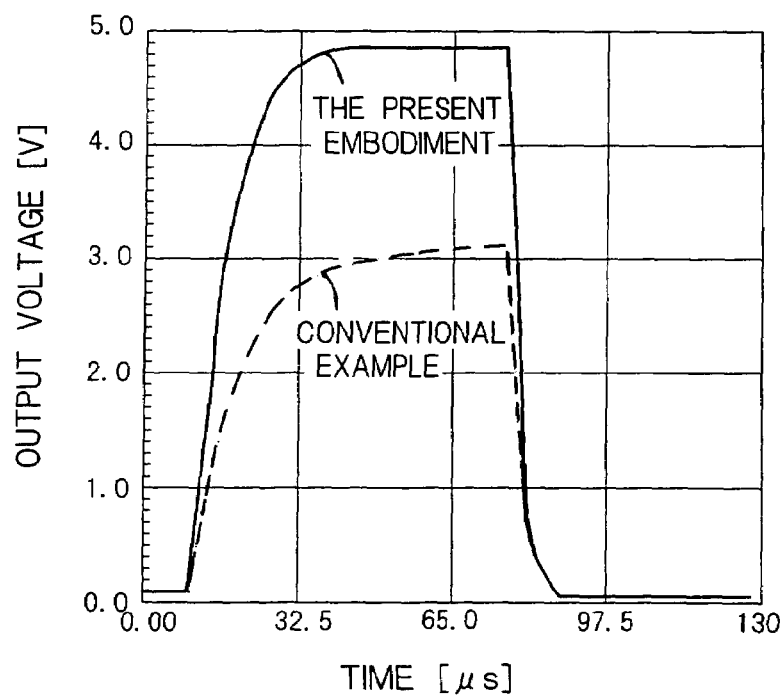
FIG. 6 is a diagram output variation for time of the circuit of the present embodiment and the conventional circuit.

FIG. 6 is a diagram showing output change for time of the circuit of the present embodiment and the conventional circuit, a horizontal axis is time, and a vertical axis is the output voltage. A solid line of FIG. 6 shows a property of the circuit of the present embodiment as shown in FIG. 1, and a dotted line shows a property of the conventional circuit of FIG. 17. As shown in FIG. 6, according to the circuit of the present embodiment, when the input voltage changes, the output voltage changes faithfully depending on change of the input voltage and fully swings until the vicinity of a power supply voltage.

Thus, when the voltage of the input IN1 is low, the differential amplifying circuit of the present embodiment operates only the second differential pair 2, and when the voltage of the input IN1 is high, only the first differential pair 1 operates. Because of this, even when the input IN1 is high or low, the operation of one of the differential pairs does not prevent the operation of the other of the differential pairs. Therefore, it is possible to enlarge operational range of the common mode voltage of the differential input signals. Because one current source I1 is commonly used by the first and second differential pairs 1 and 2, it is no likelihood to be affected by dispersion of properties of the current source I1, and it is possible to simplify the circuit configuration.

(Second Embodiment)

A second embodiment according to the present invention has a differential pair control circuit 3 having configurations different from the first embodiment.

FIG. 7 is a circuit diagram of a second embodiment of a differential amplifying circuit according to the present invention. In FIG. 7, the same reference numerals are attached to the common constituents as those of FIG. 1. Hereinafter, different points from FIG. 1 will be mainly described.

The differential amplifying circuit of FIG. 7 has a differential pair control circuit 3a having a configuration different from FIG. 1. The differential pair control circuit 3a of FIG. 7 has an NMOS transistor M8 connected between the source terminals of the NMOS transistors M3,M4 composing the second differential pair 2 and the current source I2. The gate terminal of the NMOS transistor M8 is supplied with a voltage at a connecting point between the current source I1 in the level converting circuit 4a and the NMOS transistor M7.

When the input voltage is not less than the threshold voltage of the second differential pair 2 and less than the threshold voltage of the first differential pair 1, the NMOS transistor M8 turns on, and the current from the current source I1 flows through only the second differential pair 2.

When the input voltage rises to more than the threshold voltage of the NMOS transistor M7 in the level converting circuit 4a, the NMOS transistor M8 turns off, and the current path of the second differential pair 2 is cut off.

The level converting circuit 4a in the differential amplifying circuit of FIG. 7 is different from the level converting circuit 4 of FIG. 1 in a point that the level converting circuit 4a has a current source I3 connected between the source terminal of the NMOS transistor M7 and the ground terminal. The adjustment of the gate voltage is simplified by providing the current source I3. However, the current source I3 may be omitted.

Thus, according to the second embodiment, similarly to the first embodiment, it is possible to enlarge the operational range of the common mode voltage of the differential input signals, and to commonly use one current source I1 by the first and second differential pairs 1 and 2.

(Third Embodiment)

A third embodiment has a feature in which on/off of the NMOS transistors in the differential pair control circuit is controlled by an external signal.

FIG. 8 is a circuit diagram of a third embodiment of a differential amplifying circuit according to the present invention. In FIG. 8, the same reference numerals are attached to the common constituents, and hereinafter, different points from FIG. 1 will be mainly described.

The differential amplifying circuit of FIG. 8 has a differential pair control circuit 3b having configurations different from that of Fig. .1. The differential pair control circuit 3b of FIG. 8 controls on/off of he NMOS transistors M5 and M6 by an external signal, without having the level converting circuit 4 of FIG. 1.

The gate terminals of the NMOS transistors M5 and M6 are supplied with the external signal. When the voltage of the external signal is not less than the threshold voltages of the NMOS transistors M5 and M6, the NMOS transistors M5 and M6 turn on, and the NMOS transistors M5 and M6 turn off when the voltage of the external signal is less than the threshold voltage of the NMOS transistors M5 and M6.

When the NMOS transistors M5 and M6 turn on, if one input IN1 of the differential input signals becomes equal to or more than the threshold voltage of the second differential pair 2, the second differential pair 2 operates, and the current from the current source I1 flows through the second differential pair 2. During operation of the second differential pair 2, when the voltage of the external signal becomes less than the threshold voltages of the NMOS transistors M5 and M6, the NMOS transistors M5 and M6 turn off, and the second differential pair 2 becomes non-operational state.

Thus, because the third embodiment controls whether or not to operate the second differential pair 2 by the external signal, it is unnecessary to provide the level converting circuit such as the first and second embodiments, thereby simplifying circuit configuration.

Figure 9:
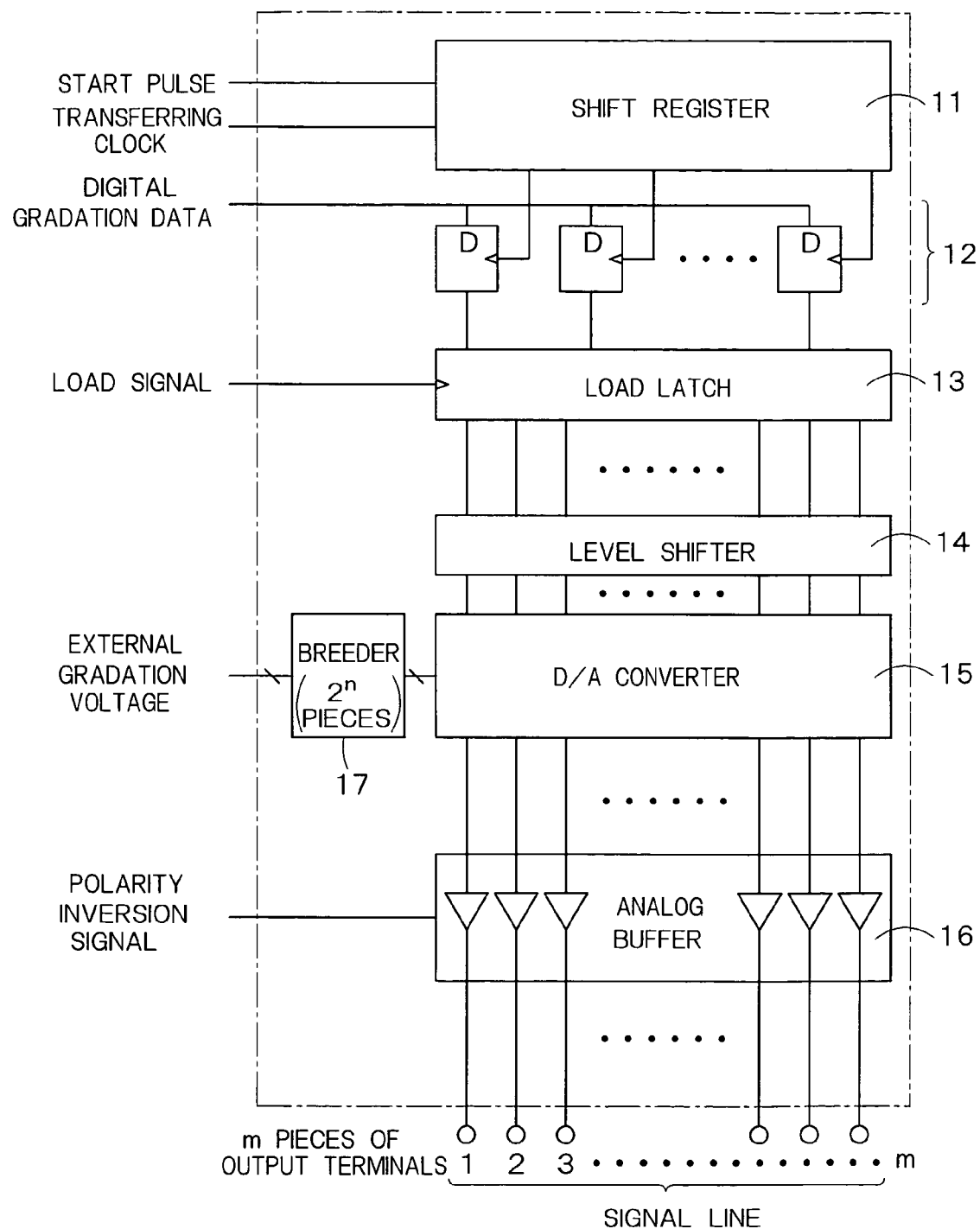
FIG. 9 is a block diagram of a semiconductor integrated circuit for LCD drive imbedding a differential amplifying circuit of FIG. 8.

Incidentally, although the external signal of FIG. 8 and the differential input signals are inputted from outside as a separated signal, it is desirable to input both signals by synthesizing them to each other. FIG. 9 is a block diagram of an semiconductor integrated circuit for LCD drive imbedding the differential amplifying circuit of FIG. 8.

The semiconductor integrated circuit for LCD drive of FIG. 9 has a shift register 11 for outputting shift pulses obtained by shifting a start pulse in sync with a transferring clock, a flip-flop 12 for latching digital gradation data in sync with the shift pulse, a load latch 13 for latching the latched output of the flip-flop 12 in sync with a load signal, a level shifter 14 for converting output level of the load latch 13, a D/A converter for converting data after level conversion into an analog signal, an analog buffer 16 having the same configuration as the circuit of FIG. 8 for amplifying the converted analog signal, and a breeder 17 for supplying a multiple types of reference voltages to the D/A converter 15. The output of the analog buffer 16 is supplied with the corresponding signal line in the pixel array part.

The output of the D/A converter 15 corresponds to the differential input signal of FIG. 8, and a polarity inversion signal inputted to the analog buffer 16 corresponds to the external signal of FIG. 8. The polarity inversion signal of FIG. 9 switches a polarity of a voltage for driving the signal lines. For example, when the signal lines are driven at positive polarity, the polarity inversion signal is set to be low level. Therefore, the NMOS transistors M5 and M6 of FIG. 8 are turned off, and the second differential pair 2 becomes non-operational state. Accordingly, the current in accordance with the output of the D/A converter 15 flows from the current source I1 through the first differential pair 1.

On the other hand, when the signal lines are driven at negative polarity, the polarity inversion signal is set to be high level. Therefore, the second differential pair 2 becomes operational state, and the current in accordance with the output of the D/A converter 15 flows from the current source I1 through the second differential pair 2.

Thus, when the external signal is inputted separately from the input signal to control on/off of the NMOS transistors M5 and M6 in the differential pair control circuit 3b, it is possible to control the switching of on/off of the second differential pair 2 at arbitrary timing.

(Fourth Embodiment)

A fourth embodiment supplies the external signal by omitting the level converting circuit 4 of the second embodiment.

Figure 10:
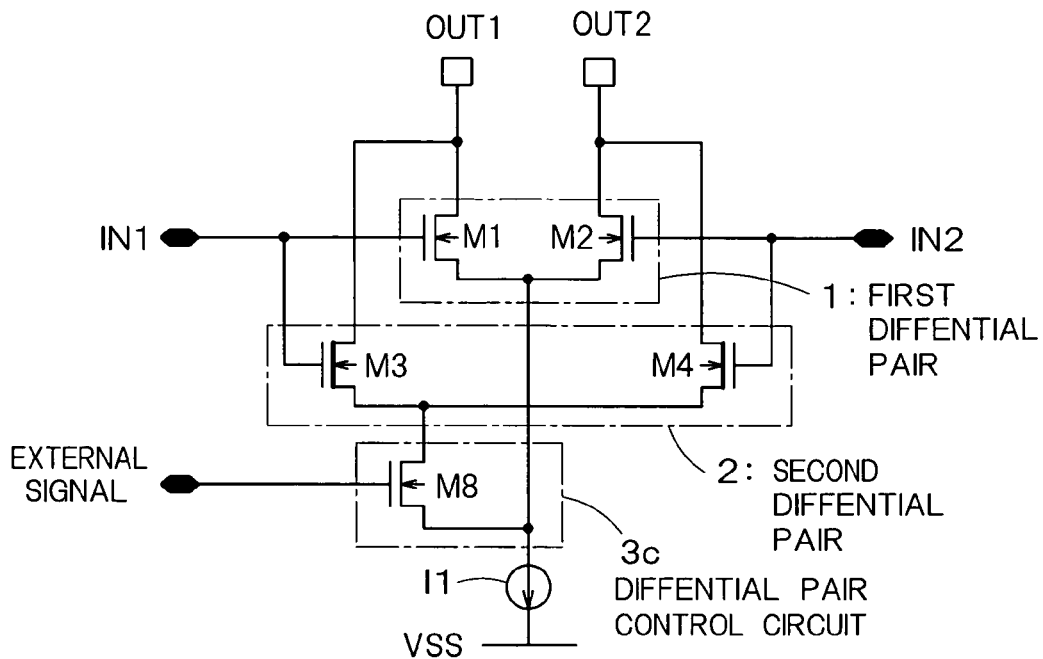
FIG. 10 is a circuit diagram of a fourth embodiment of a differential amplifying circuit according to the present invention.

FIG. 10 is a circuit diagram of a fourth embodiment of a differential amplifying circuit according to the present invention. In FIG. 10, the same reference numerals are attached to the constituents common to that of FIG. 7. Hereinafter, different points from Fig. 1 will be mainly described.

The differential amplifying circuit of FIG. 10 has a differential pair control circuit 3 having the configuration different from that of FIG. 7. The differential pair control circuit 3c supplies the external signal to the gate terminal of the NMOS transistor M8, instead of the level converting circuit 4a in the differential pair control circuit 3a of FIG. 7.

Therefore, it is possible to control the switching of the operation of the second differential pair 2 by the external signal.

(Fifth Embodiment)

A fifth embodiment adds a diode for stabilizing the operation to the circuit of the second embodiment.

Figure 11:
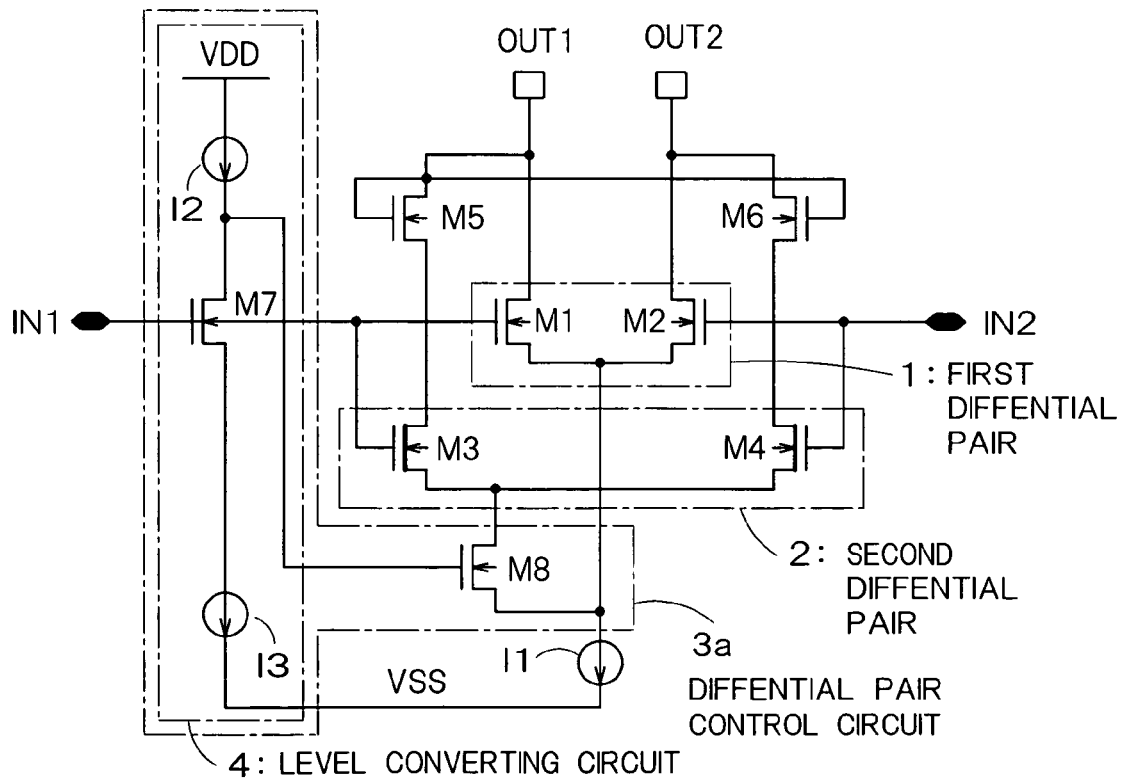
FIG. 11 is a circuit diagram of a fifth embodiment of a differential amplifying circuit according to the present invention.

FIG. 11 is a circuit diagram of a fifth embodiment of a differential amplifying circuit according to the present invention. In FIG. 11, the same reference numerals are attached to the constituents common to that of FIG. 7. Hereinafter, different points from FIG. 1 will be mainly described.

The differential amplifying circuit of FIG. 11 is different from the differential amplifying circuit of FIG. 7 in a point that NMOS transistors M5 and M6 are connected in series to the drain terminals of the NMOS transistors M3 and M4 composing the second differential pair 2. The differential amplifying circuit of FIG. 11 is different from that of FIG. 7. The gate terminals and the drain terminals of The NMOS transistors M5 and M6 are shortcut to function as a diode.

Thus, the NMOS transistors M5 and M6 composing the diode are connected to the drain terminals of the NMOS transistors M3 and M4. Therefore, it is possible to raise the signal level of the output terminal of the differential amplifying circuit, thereby stabilizing the operation of the circuit.

(Sixth Embodiment)

A sixth embodiment adds a diode for stabilizing the operation to the circuit of the fourth embodiment.

FIG. 12 is a circuit diagram of the sixth embodiment of a differential amplifying circuit according to the present invention. In FIG. 12, the same reference numerals are attached to the constituents common to those of FIG. 10. Hereinafter, different points from FIG. 10 will be mainly described.

In the differential amplifying circuit of FIG. 12, the NMOS transistors M5 and M6 are connected in series to the drain terminals of the NMOS transistors M3 and M4. Therefore, it is possible to stabilize the operation of the circuit.

(Seventh Embodiment)

A seventh embodiment is a modified example, and adds a transistor for controlling a switching of operation/non-operation of the first differential pair 1.

FIG. 13 is a circuit diagram of the seventh embodiment of a differential amplifying circuit according to the present invention. In FIG. 13, the same reference numerals are attached to the constituents common to those of FIG. 8. Hereinafter, different points from FIG. 8 will be mainly described.

The differential pair control circuit 3d of FIG. 13 has an NMOS transistor M9 connected between the drain terminal of the NMOS transistor M1 and the output terminal OUT1, and an NMOS transistor M10 connected between the drain terminal of the NMOS transistor M2 and the output terminal OUT2. The NMOS transistors M9 and M10 controls a switching of operation/non-operation of the first differential pair 1. The gate terminals of the NMOS transistors M9 and M10 is supplied with a signal inverting the external signal by the inverter.

When the external signal is in high level, the NMOS transistors M5 and M6 turn on and the NMOS transistors M9 and M10 turn off. Accordingly, the current from the current source I1 flows through only the second differential pair 2.

On the other hand, when the external signal is in low level, the NMOS transistors M5 and M6 turn off and the NMOS transistors M9 and M10 turn on. Accordingly, the current form the current source I1 flows through only the first differential pair 1.

Thus, because the NMOS transistors M9 and M10 are provided, it is possible to operate either one of the first and second differential pairs 1 and 2, and to surely enlarge the operational range of the common mode voltage of the differential input signals.

(Eighth Embodiment)

A eighth embodiment is a circuit diagram showing a concrete realized example of a differential amplified amplifier of the first embodiment.

Figure 14:
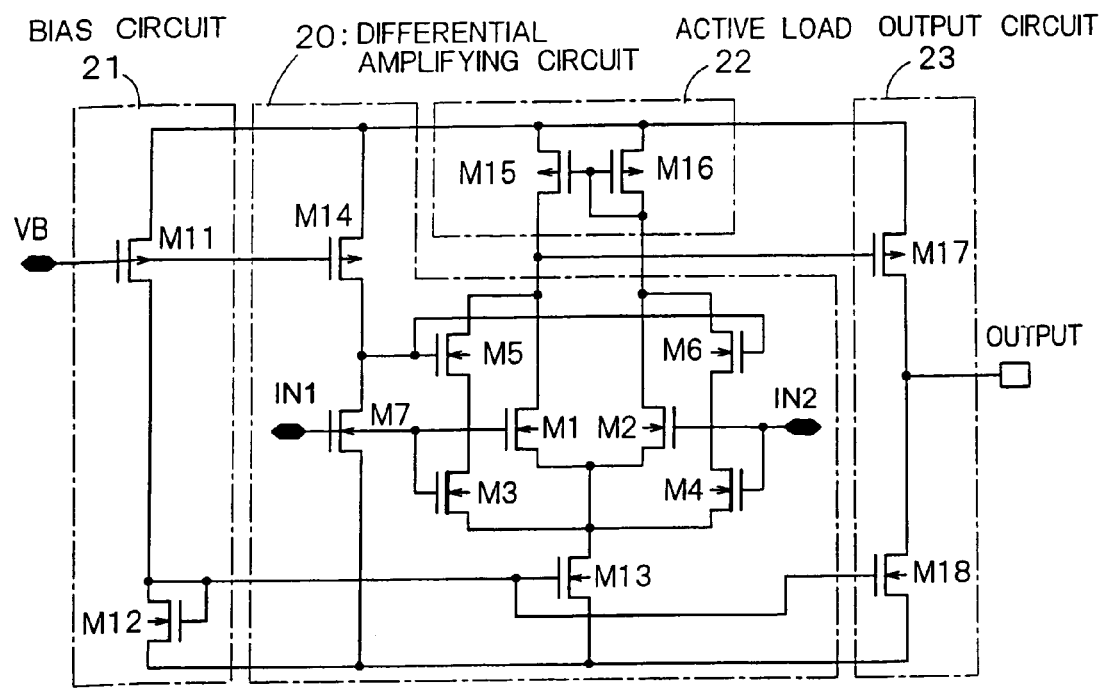
FIG. 14 is a circuit diagram showing a concrete realized example of a differential amplifying circuit a first embodiment.

The circuit of FIG. 14 has a bias circuit 21 for controlling the current flowing through the current source I1 in the differential amplifying circuit, an active load 22 connected to output terminals of a differential amplifying circuit 20 with the same configuration as that of FIG. 1, and an output circuit 23 connected to the output terminal of the differential amplifying circuit 20.

The bias circuit 21 has a PMOS transistor M11 of which a gate terminal is supplied with a bias voltage VB, and an NMOS transistor M12 composing the current source I1 connected in series to the PMOS transistor M11. The same current as that flowing through the NMOS transistor M12 flows through the NMOS transistor M13 composing the current source I1.

The active load 22 is composed of the PMOS transistors M15 and M16 of current mirror configuration. The output circuit 23 has a PMOS transistor M17 of which a gate terminal is applied with the output voltage of the differential amplifying circuit 20, and an NMOS transistor M18 for functioning as the current source I1 connected in series to the PMOS transistor M17.

Thus, because the entire circuit of FIG. 14 is composed of MOS transistors, it is possible to easily integrate the entire differential amplifying circuit 20.

Figure 15:
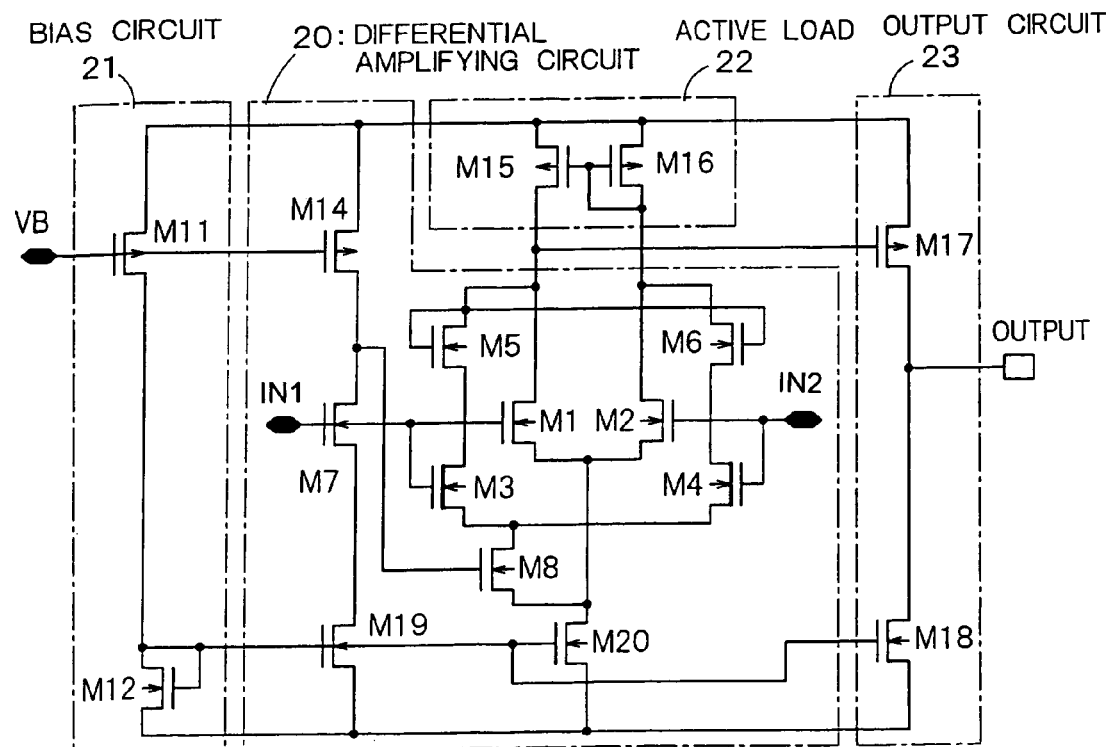
FIG. 15 is a circuit diagram showing a concrete realized example of a differential amplifying circuit of FIG. 11.
Figure 16:
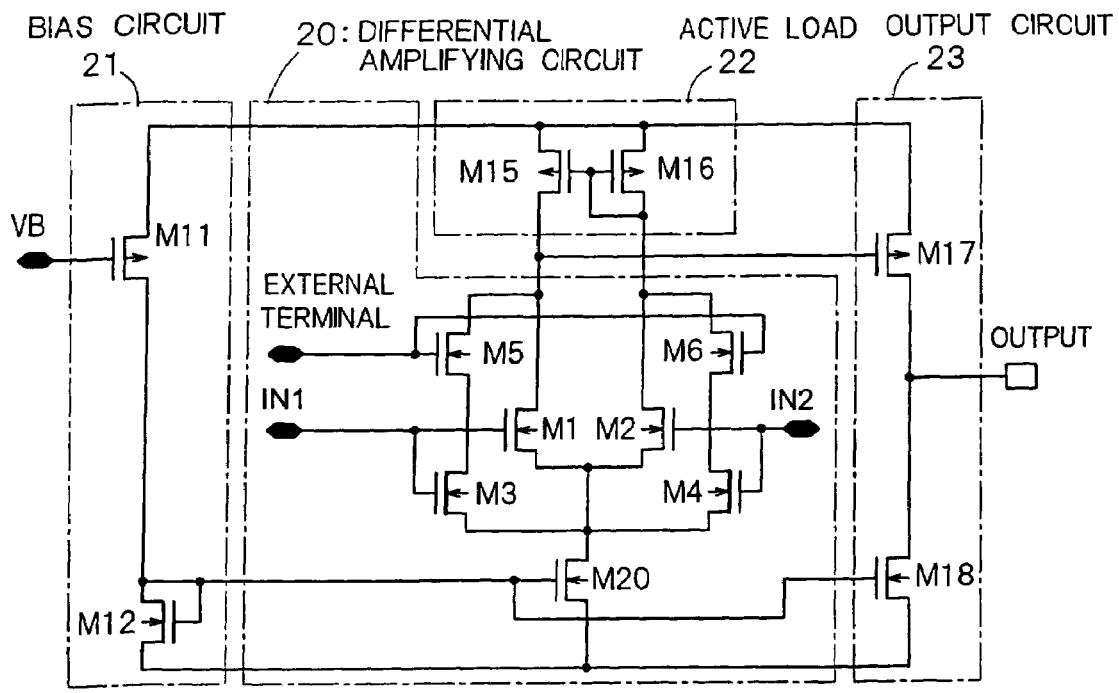
FIG. 16 is a circuit diagram showing a concrete realized example of a differential amplifying circuit of FIG. 8.

With regard to the respective differential amplifying circuits shown in FIG. 7, 8, 10 and 11–13, it is possible to connect the bias circuit 21, the active load 22 and the output circuit 23 similarly to FIG. 14 may be connected. For example, FIGS. 15 and 16 show circuit configurations adding the bias circuit 21, the active load 22 and the output circuit 23 to the circuits of FIGS. 11 and 8.

In the above-mentioned embodiment, an example in which the differential amplifying circuit 20 is composed of the NMOS transistors has been described. However, the differential amplifying circuit 20 can be composed of the PMOS transistors. In this case, except that the connection locations of the power supply terminal and the ground terminal are reversed, circuit configuration becomes the same as that of the above-mentioned respective circuits.

What is claimed is:

1. A differential amplifying circuit, comprising:
    a first differential pair having first and second transistors of the same polarity, which outputs differential output signals in accordance with differential input signals supplied to gate terminals of said first and second transistors from differential output terminals;
    a second differential pair having third and fourth transistors having the same polarity as that of said first and second transistors with threshold voltages different from those of said first and second transistors, which outputs differential output signals in accordance with said differential input signals supplied to gate terminals of said third and fourth transistors from said differential output terminals;
    a bias supply part which supplies bias current to said first and second differential pairs; and
    a differential pair control part which controls whether or not to operate said second differential pair;
    wherein said bias supply part has only one current source which supplies current to said first and second differential pairs.

2. The differential amplifying circuit according to claim 1, wherein said differential pair control part includes:
    a fifth transistor of the same polarity as that of said third transistor, said fifth transistor being connected to a current path on which current from said bias supply part flows through said third transistor; and
    a sixth transistor of the same polarity as that of said fourth transistor, said sixth transistor being connected to a current path on which current from said bias supply part flows through said fourth transistor.

3. The differential amplifying circuit according to claim 2, wherein said differential pair control part has a current source and a seventh transistor connected in series between first and second reference voltage terminals;
    said seventh transistor has the same polarity as that of said first through sixth transistors, a gate terminal of said seventh transistor being supplied with one of said differential input signals; and
    gate terminals of said fifth and sixth transistors are supplied with a voltage of a connection path between said current source and said seventh transistor.

4. The differential amplifying circuit according to claim 3, further comprising:
    a bias circuit which controls an impedance of said current source and bias current which flows through said bias supply part;
    an active load part connected to said differential output terminal; and
    an output circuit connected to said differential output terminal,
    wherein all circuit elements in said differential amplifying circuit are composed of MOS transistors.

5. The differential amplifying circuit according to claim 2, wherein gate terminals of said fifth and sixth transistors are controlled by an external signal.

6. The differential amplifying circuit according to claim 5, wherein said differential pair control circuit includes:
    a ninth transistor which controls whether or not to lead current between a drain and a source of said first transistor in accordance with a logic of said external signal; and
    a tenth transistor which controls whether or not to lead current between a drain and a source of said second transistor in accordance with a logic of said external signal.

7. The differential amplifying circuit according to claim 1, wherein said differential pair control part is connected to a current path on which current from said bias supply part passes through said third transistor, is connected to a current path on which current from said bias supply part passes through said fourth transistor, and has a eighth transistor of the same polarity as that of said third and fourth transistors.

8. The differential amplifying circuit according to claim 7, wherein said differential pair control part has a current source and a seventh transistor connected in series between first and second reference voltage terminals;
    said seventh transistor having the same polarity as that of said first through fourth and eighth transistors, a gate terminal of said seventh transistor being supplied with one of said differential input signals; and
    a gate terminal of said eighth transistor being supplied with a voltage of a connection path between said current source and said seventh transistor.

9. The differential amplifying circuit according to claim 7, wherein a gate voltage of said eighth transistor is controlled by an external signal.

10. The differential amplifying circuit according to claim 9, further comprising:

a first current source connected to a current path on which current from said bias supply part passes through said third transistor; and a second current source connected to a current path on which current from said bias supply part passes through said fourth transistor.

11. The differential amplifying circuit according to claim 7, further comprising:

a first current source connected to a current path on which current from said bias supply part passes through said third transistor; and a second current source connected to a current path on which current from said bias supply part passes through said fourth transistor.

12. A semiconductor integrated circuit for LCD drive, comprising:

a D/A converting circuit which converts digital pixel data into an analog pixel voltage; and an analog buffer which performs buffering of said analog pixel voltage and supplies the buffered analog pixel voltage to the corresponding signal line, wherein said analog buffer has a differential amplifying circuit which performs differential amplification of said analog pixel voltage outputted from said D/A converting circuit at differential signals;

said differential amplifying circuit including:

a first differential pair having first and second transistors of the same polarity, gate terminals of said first and second transistors being supplied with differential input signals;

a second differential pair having third and fourth transistors of the same polarity with threshold voltages different from those of said first and second transistors, gate terminals of said third and fourth transistors being supplied with said differential input signals;

a bias supply part which supplies bias current to said first and second differential pairs; and a differential pair control part which controls whether or not to operate said second differential pair;

wherein said bias supply part has only one current source which supplies current to said first and second differential pairs.

13. The semiconductor integrated circuit for LCD drive according to claim 12, wherein said differential pair control part includes:

a fifth transistor of the same polarity as that of said third transistor, said fifth transistor being connected to a current path on which current from said bias supply part passes through said third transistor, and a sixth transistor of the same polarity as that of said fourth transistor, said sixth transistor being connected to a current path on which current from said bias supply part passes through said fourth transistor.

14. The semiconductor integrated circuit for LCD drive according to claim 13, wherein gate voltages of said fifth and sixth transistors are controlled by an external signal for indicating polarity inversion drive of said signal line.

* * * * *